United States Patent

Amberger et al.

[15] 3,678,362

[45] July 18, 1972

[54] SOLID STATE PULSER USING PARALLEL STORAGE CAPACITORS

[72] Inventors: Donald J. Amberger, Hauppauge; Robert A. Celentano, Huntington, both of N.Y.

[73] Assignee: The United States of America as represented by the Secretary of the Army

[22] Filed: Sept. 17, 1970

[21] Appl. No.: 72,954

[52] U.S. Cl. ....................................320/1, 307/108, 307/109
[51] Int. Cl. ...................H02m 3/10, H02m 3/18, H03k 3/57
[58] Field of Search .......................307/109, 110, 108; 320/1

[56] References Cited

UNITED STATES PATENTS

| | | | |
|---|---|---|---|
| 3,505,586 | 4/1970 | Dulin | 307/110 |
| 3,513,376 | 5/1970 | Hajek | 307/110 |
| 3,111,594 | 11/1963 | Stolte | 307/110 |

OTHER PUBLICATIONS

Frank B. A. Frungel, High Speed Pulse Technology, Vol. 1, pp. 131, 132, 1965,

*Primary Examiner*—Bernard Konick
*Assistant Examiner*—Stuart Hecker
*Attorney*—Harry M. Saragovitz, Edward J. Kelly, Herbert Berl and James T. Deaton

[57] ABSTRACT

A solid state pulse generator that produces high current narrow pulses and includes a bank of parallel silicon controlled rectifier-capacitor combinations, designed for driving a gallium arsenide diode laser. A trigger circuit is connected to all the gate circuits of the silicon controlled rectifiers, through separate adjustable resistors. The adjustable resistors make it possible to simultaneously fire the silicon controlled rectifiers with a single trigger pulse.

7 Claims, 1 Drawing Figure

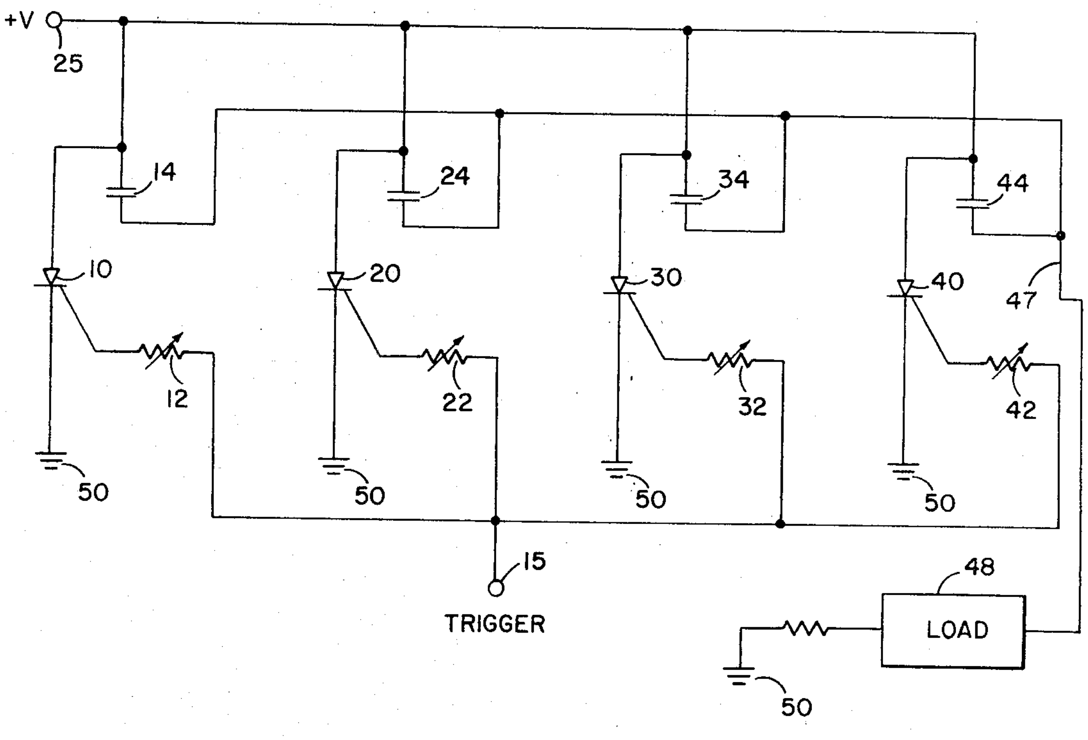
Donald Amberger
Robert A. Celentano,
INVENTORS.
BY Harry M. Saragovitz
Edward J. Kelly
Herbert Berl
James T. Deaton

SOLID STATE PULSER USING PARALLEL STORAGE CAPACITORS

BACKGROUND OF THE INVENTION

This invention is in the field of pulser circuits and is, in particular, a solid state high current, narrow pulse generator for driving a laser diode. A disadvantage of magnetic circuits and electron tubes over solid state pulse generators is that they are less reliable. The radar transmitter tube pulser art and vacuum tube or magnetic circuit devices have recently been used in producing high current, narrow pulses since they had the inherent fast switching and high current producing feature.

SUMMARY OF THE INVENTION

The present invention is a solid state pulse generator for driving a gallium arsenide diode laser. The invention comprises means for producing a high current output pulse of 90 nanosecond duration from a bank of parallel silicon controlled rectifier-capacitor combinations by triggering all the silicon controlled rectifiers simultaneously. Briefly, a plurality of silicon controlled rectifiers are connected in parallel having their anodes connected to a positive voltage source and to one side of a related capacitor. The other side of all the capacitors is connected to a gallium arsenide diode laser. The cathodes of the plurality of silicon controlled rectifiers are connected to ground. The gate circuits of the plurality of silicon controlled rectifiers are connected to a source of trigger voltage through individual adjustable resistors, whereby the adjustable resistors can be adjusted so that all the silicon controlled rectifiers are fired simultaneously.

An object of this invention is to provide a high current output pulse of short duration from a bank of parallel silicon controlled rectifier-capacitor combinations by gating all the silicon controlled rectifiers on simultaneously.

Another object of the present invention is to provide a solid state pulser having more reliability than the previous magnetic and electron tube type pulsers.

Another object of the present invention is to provide silicon controlled rectifier-capacitor combinations in parallel that operate as individual current sources.

Other objects will be readily appreciated and the invention may be better understood by reference to the following detailed description when considered in connection with the accompanying drawing.

BRIEF DESCRIPTION OF THE DRAWING

FIGURE 1 is a schematic circuit diagram of the preferred embodiment of the invention.

DESCRIPTION OF THE PREFERRED EMBODIMENT

Referring now to FIG. 1, a solid state pulse generator of the present invention is shown with a positive voltage source V at terminal 25, connected to the anodes of silicon controlled rectifiers 10, 20, 30, and 40, that gives a nominal forward bias to the silicon controlled rectifiers with their cathodes connected to ground 50. Silicon controlled rectifiers 10, 20, 30, and 40 are connected in parallel with capacitors 14, 24, 34, and 44, between the positive voltage source and ground. The pulser has a single output circuit 47 for all of the capacitors. The output load 48 may be a gallium arsenide injection laser connected to ground 50. Each silicon controlled rectifier-capacitor combination forms an individual current source for pulsing the injection laser. Adjustable resistors 12, 22, 32, and 42 are connected in the gate circuits of silicon controlled rectifiers 10, 20, 30, and 40 respectively and serve as a means of adjustment whereby the silicon controlled rectifiers can be caused to conduct simultaneously and cause capacitors 14, 24, 34, and 44 to simultaneously discharge through load 48. The gate circuits of all the silicon controlled rectifiers are connected to terminal 15 which is adapted for receiving a trigger pulse. Adjustable resistors 12, 22, 32, and 42 serve as a means of adjustment whereby silicon controlled rectifiers 10, 20, 30, and 40 can be caused to conduct simultaneously from the same trigger pulse and cause capacitors 14, 24, 34, and 44 to simultaneously discharge through load 48.

The operation of the pulser will now be explained using only one of the silicon controlled rectifier-capacitor combinations as a current source, since all the current sources work the same. The positive voltage V, at terminal 25, charges capacitor 14 positively and holds the anode of silicon controlled rectifier 10 at a nominal value short of conduction for silicon controlled rectifier 10. The cathode of silicon controlled rectifier 10 is connected to ground 50. The gate circuit of silicon controlled rectifier 10 is connected, through adjustable resistor 12, to terminal 15 that is adapted for receiving a positive trigger pulse. When a positive trigger pulse is applied to terminal 15, silicon controlled rectifier 10 will be gated on, thus shunting the positive charge from the battery side of capacitor 14 to ground 50. The output side of capacitor 14 will, therefore, cause a positive charge pulse to travel through injection laser 48 to ground 50.

By adjusting the adjustable resistor 12 in the gating circuit of silicon controlled rectifier 10, the firing voltage of silicon controlled rectifier 10 can be changed. With adjustable resistors 22, 32, and 42 adjusted to fire silicon controlled rectifiers 20, 30, and 40 simultaneously with silicon controlled rectifier 10, a much higher current pulse can be produced through injection laser 48 to ground 50. A number of silicon controlled rectifier-capacitor combinations may be added as independent current sources according to the load 48 requirement.

The bank of silicon controlled rectifier-capacitors makes possible pulsers for laser diodes, or even radar transmitter tubes, having lower cost, lower weight and better reliability than the previous magnetic and electron tube type pulse generator. Each silicon controlled rectifier in the bank can produce a 30 ampere current in a pulse of 90 nanoseconds duration. The total number of silicon controlled rectifier-capacitor combinations required can be determined by calculating the current need for the pulse. Paralleling the entire silicon controlled rectifier-capacitor combinations as independent current producing sources satisfactorily provides the required current level.

A version of the invention includes using four type MCR729–8 silicon controlled rectifiers that produced 180 ampere pulses of 150 nanoseconds width when triggered. The four silicon controlled rectifier-capacitor combinations have the same output connected to one side of a gallium-arsenide laser. All of the combinations operate as an individual current source when adjusted so that the silicon controlled rectifiers pulse simultaneously. The four silicon controlled rectifiers can be adjusted to pulse simultaneously by selecting the proper resistance in each adjustable resistor located in the individual gate circuit leads. A maximum current pulse is obtained when all the silicon controlled rectifiers pulse simultaneously.

While a specific embodiment of the invention has been shown and described, other embodiments may be obvious to one skilled in the art, in light of this disclosure. The invention should be limited in scope only by the following claims.

We claim:

1. A device for generating a pulse through a load and comprising: a plurality of capacitors connected in parallel; voltage means for charging said capacitors; and means for simultaneously discharging said capacitors through said load, said means for simultaneously discharging said capacitors comprising a plurality of silicon controlled rectifiers connected to a first side of each said capacitor, means connecting a trigger pulse to the gate of each said silicon controlled rectifier and causing said plurality of capacitors to simultaneously discharge through said load when said trigger pulse is applied, said connecting means includes an adjustable resistor for each said silicon controlled rectifier, to thereby enable the silicon controlled rectifiers to be simultaneously triggered.

2. A device as set forth in claim 1, wherein said load is an injection laser.

3. A device as set forth in claim 1, wherein said voltage means is connected in parallel to said capacitors.

4. A device as set forth in claim 1, wherein said voltage means is connected to said first side of each said capacitor.

5. A device as set forth in claim 4 wherein said load is connected at one side to a second side of each said capacitor and at the other side thereof to ground.

6. A device as set forth in claim 5, wherein said load is an injection laser.

7. A device as set forth in claim 6, wherein said injection laser is a gallium arsenide diode laser.

* * * * *